US009788430B1

(12) United States Patent
Folker et al.

(10) Patent No.: US 9,788,430 B1
(45) Date of Patent: Oct. 10, 2017

(54) STACKED MAGNETIC ASSEMBLY

(71) Applicant: Universal Lighting Technologies, Inc., Madison, AL (US)

(72) Inventors: Donald Folker, Madison, AL (US); John J. Dernovsek, Madison, AL (US); Mike LeBlanc, Huntsville, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 330 days.

(21) Appl. No.: 14/573,102

(22) Filed: Dec. 17, 2014

Related U.S. Application Data

(60) Provisional application No. 61/916,985, filed on Dec. 17, 2013.

(51) Int. Cl.
*H01F 27/30* (2006.01)
*H01F 27/29* (2006.01)
*H05K 1/18* (2006.01)

(52) U.S. Cl.
CPC ............. *H05K 1/18* (2013.01); *H01F 27/306* (2013.01)

(58) Field of Classification Search
USPC ........................................................ 336/212
See application file for complete search history.

(56) References Cited

U.S. PATENT DOCUMENTS

| 6,727,793 | B2 * | 4/2004 | Piechnick | ................. H01F 5/02 336/198 |
| 8,498,124 | B1 * | 7/2013 | Folker | .................... H05K 1/145 361/740 |
| 2008/0088403 | A1 * | 4/2008 | Suzuki | ............... H05B 41/2822 336/198 |
| 2008/0169769 | A1 * | 7/2008 | Lee | .................... H05B 41/2822 315/278 |

* cited by examiner

*Primary Examiner* — Ronald Hinson
(74) *Attorney, Agent, or Firm* — Patterson Intellectual Property Law, PC; Mark J. Patterson; Jerry Turner Sewell

(57) ABSTRACT

A magnetic device for an electronic circuit includes a printed circuit board. A first and second magnetic component assembly can be electrically connected to the printed circuit. The second magnetic component assembly can be stacked on the first magnetic component assembly. The first magnetic component assembly can be positioned between the second magnetic component assembly and the printed circuit board. Each magnetic component assembly can include a bobbin, a winding disposed on the bobbin, and a core extending through the bobbin. A second bobbin on the second magnetic component can be positioned on either a first core or a first bobbin of the first magnetic component assembly. The stacked magnetic component configuration can help reduce the board space required to electrically connect both the first and second magnetic component assemblies to the printed circuit board, which can help increase the power density of the magnetic device.

14 Claims, 7 Drawing Sheets

STACKED MAGNETIC ASSEMBLY

CROSS-REFERENCES TO RELATED APPLICATIONS

This application claims benefit of U.S. Patent Application Ser. No. 61/916,985, filed Dec. 17, 2013, entitled "Stacked Magnetic Assembly".

A portion of the invention of this patent document contains material that is subject to copyright protection. The copyright owner has no objection to the reproduction of the patent document or the patent invention, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to magnetic devices for electronic circuit applications, including magnetic devices used as inductors or transformers within an electronic circuit. More particularly, this invention pertains to a magnetic device having multiple magnetic component assemblies.

Magnetic component assemblies in the art include a bobbin, a winding wound around the bobbin, and a magnetically permeable core inserted through the bobbin. A magnetic component assembly can be connected to a printed circuit board such that the magnetic component assembly can be incorporated into an electronic circuit. In conventional solutions, as shown in FIG. 1, when multiple magnetic component assemblies are needed for an electronic circuit, the magnetic component assemblies are connected to the printed circuit board in a side by side orientation.

One disadvantage of such a configuration is that a substantial amount of printed circuit board space is required to connect multiple magnetic component assemblies on the same printed circuit board, since the magnetic component assemblies are positioned next to each other. As such, the power density of the overall magnetic device can be reduced or limited.

Another disadvantage of conventional solutions is that in those devices including an enclosure, the windings of the magnetic component assemblies can be spaced apart from the top of the enclosure. As such, a substantial amount of thermal potting material is often needed between the tops of the windings and the enclosure to effectively transfer heat between the windings and the enclosure. Having to use a large amount of thermal potting material can undesirably increase the cost of the magnetic device.

What is needed, then, are improvements in magnetic devices having multiple magnetic component assemblies.

BRIEF SUMMARY OF THE INVENTION

One aspect of the present invention is a magnetic device for an electronic circuit including a printed circuit, a first magnetic component assembly electrically connected to the printed circuit board, and a second magnetic component assembly electrically connected to the printed circuit board. The second magnetic component assembly can be stacked on the first magnetic component assembly. The two magnetic component assemblies arranged in a stacked orientation can help increase the power density of the magnetic device as less board space is necessary to connect both magnetic component assemblies to the printed circuit board. In some embodiments, the second magnetic component assembly can be positioned on or rest on the first magnetic component assembly.

Another aspect of the present invention is a magnetic device for an electronic circuit that includes a printed circuit board. A first magnetic component assembly can be electrically connected to the printed circuit board. The first magnetic component assembly can include a first bobbin having a first axial passage, a first core having a first core leg extending into the first axial passage, and a first winding disposed around the first bobbin. A second magnetic component assembly can include a second bobbin having a second axial passage, a second core having a second core leg extending into the second axial passage, and a second winding disposed around the second bobbin. The second magnetic component assembly can be positioned between the first magnetic component assembly and the printed circuit board. In some embodiments, the second bobbin of the second magnetic component assembly can be positioned on the first bobbin of the first magnetic component assembly. In other embodiments, the second bobbin of the second magnetic component assembly can be positioned on the first core of the first magnetic component assembly.

One object of the present invention is to provide a magnetic device with stacked magnetic components.

Another object of the present invention is to help increase the power density of magnetic devices.

Yet another aspect of the present invention is to help utilize the available space within an enclosure of a magnetic device.

Numerous other objects, advantages and features of the present invention will be readily apparent to those of skill in the art upon a review of the following drawings and description of a preferred embodiment.

DETAILED DESCRIPTION OF THE INVENTION

Figure 1:
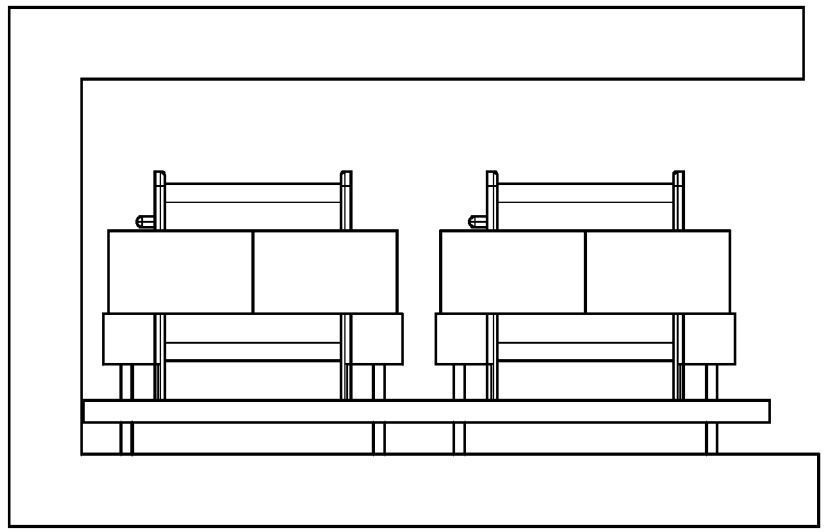
FIG. 1 is a front view of an embodiment of a conventional magnetic device.

While the making and using of various embodiments of the present invention are discussed in detail below, it should be appreciated that the present invention provides many applicable inventive concepts that is embodied in a wide variety of specific contexts. The specific embodiments discussed herein are merely illustrative of specific ways to make and use the invention and do not delimit the scope of the invention.

To facilitate the understanding of the embodiments described herein, a number of terms are defined below. The terms defined herein have meanings as commonly understood by a person of ordinary skill in the areas relevant to the present invention. Terms such as "a," "an," and "the" are not intended to refer to only a singular entity, but rather include the general class of which a specific example may be used for illustration. The terminology herein is used to describe specific embodiments of the invention, but their usage does not delimit the invention, except as set forth in the claims.

As described herein, an upright position is considered to be the position of apparatus components while in proper operation or in a natural resting position as described herein. Vertical, horizontal, above, below, side, top, bottom and other orientation terms are described with respect to this upright position during operation unless otherwise specified. The term "when" is used to specify orientation for relative positions of components, not as a temporal limitation of the claims or apparatus described and claimed herein unless otherwise specified. The term "lateral" denotes a side to side direction when facing the "front" of an object.

The phrase "in one embodiment," as used herein does not necessarily refer to the same embodiment, although it may. Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It will be understood that the particular embodiments described herein are shown by way of illustration and not as limitations of the invention. The principal features of this invention may be employed in various embodiments without departing from the scope of the invention. Those of ordinary skill in the art will recognize numerous equivalents to the specific procedures described herein. Such equivalents are considered to be within the scope of this invention and are covered by the claims.

All of the apparatuses and/or methods disclosed and claimed herein may be made and/or executed without undue experimentation in light of the present invention. While the apparatuses and methods of this invention have been described in terms of the embodiments included herein, it will be apparent to those of ordinary skill in the art that variations may be applied to the apparatuses and/or methods and in the steps or in the sequence of steps of the method described herein without departing from the concept, spirit, and scope of the invention. All such similar substitutes and modifications apparent to those skilled in the art are deemed to be within the spirit, scope, and concept of the invention as defined by the appended claims.

Figure 2:
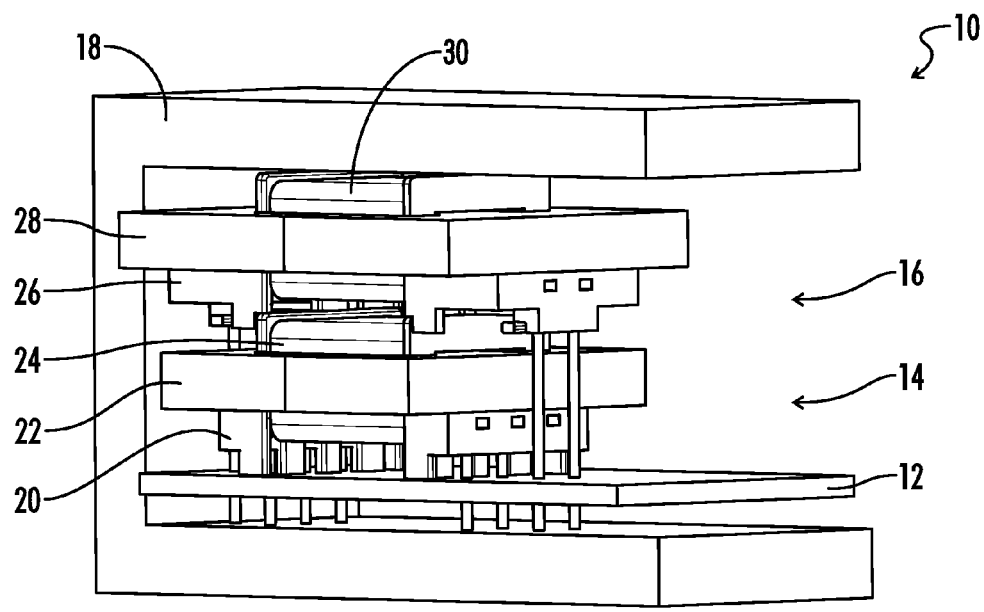
FIG. 2 is a perspective of an embodiment of a magnetic device of the present invention having multiple magnetic component assemblies in accordance with an aspect of the present invention.

An embodiment of a magnetic device 10 according to the present invention is shown in FIG. 2 in a generally upright position. However, the magnetic device 10 of FIG. 2 can be placed in a variety of orientations. Directional or orientation terms used hereinafter are used for clarity in describing the orientation shown in FIG. 2, but such directional terms should not be construed as a limitation on the scope of the invention.

The magnetic device 10 can include a printed circuit board 12. A first or lower magnetic component assembly 14 can be electrically connected to the printed circuit board 12. A second or upper magnetic component assembly 16 can also be electrically connected to the printed circuit board 12. The second magnetic component assembly 16 can be stacked on the first magnetic component assembly 14. The second magnetic component assembly 16 being stacked on the first magnetic component assembly 14 can be defined as the second magnetic component assembly 16 being positioned on top of the first magnetic component assembly 14. In some embodiments, the second magnetic component assembly 16 can be positioned on or configured to rest on the first magnetic component assembly 14. In some embodiments, the first magnetic component 14 can be described as being positioned between the second magnetic component 16 and the printed circuit board 12.

Having two magnetic component assemblies 14 and 16 stacked on top of one another can help reduce the amount of board space necessary to connect both magnetic components 14 and 16 to the printed circuit board 12. As such, the power density of the magnetic device 10 can be increased. Additionally, in some embodiments, the magnetic device 10 can include an enclosure 18 at least partially covering the first and second magnetic component assemblies 14 and 16. In such embodiments, the magnetic component assemblies 14 and 16 can utilize a larger portion of the space within the enclosure 18, which can help decrease the overall size of the magnetic device 10.

The first magnetic component assembly 14 can include a first bobbin 20, a first core 22 extending through the first bobbin 20, and a first winding 24 disposed around the first bobbin 20. The second magnetic component assembly 14 can include a second bobbin 26, a second core 28 extending through the second bobbin 26, and a second winding 30 disposed around the second bobbin 26.

Figure 3:
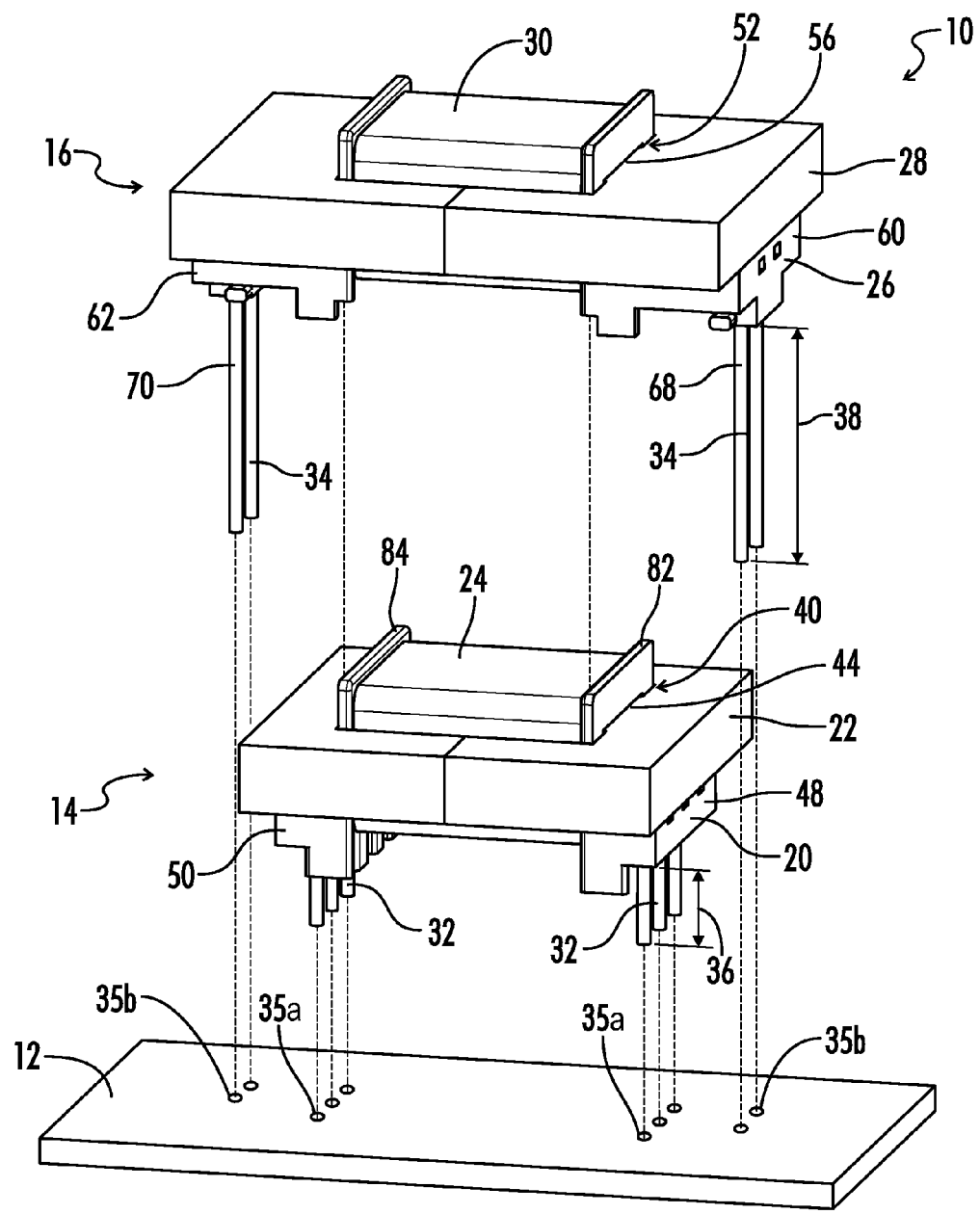
FIG. 3 is a partial exploded view of the magnetic device of FIG. 2.

A partial exploded view of the embodiment of FIG. 2 is shown in FIG. 3. The second component assembly 16 can generally be positioned over the first component assembly 14, with both magnetic component assemblies 14 and 16 being electrically connected to the printed circuit board 12. The first magnetic component assembly 14 can include a first set of terminal pins 32. The first set of terminal pins 32 can be inserted into the first bobbin 20 and used to electrically connect the first magnetic component assembly 14, and particularly the first winding 24, to the printed circuit board 12. Similarly, the second magnetic component assembly 16 can include a second set of terminal pins 34. The second set of terminal pins 34 can be inserted into the second bobbin 26 and used to electrically connect the second magnetic component 16, and particularly the second winding 30, to the printed circuit board 12. The first set of terminal pins 32 can be inserted into a first set of corresponding vias 35*a* on the printed circuit board 12. The second set of terminal pins 34 can be inserted into a second set of corresponding vias 35*b* on the printed circuit board 12.

Each terminal pin in the first set of terminal pins 32 can have a first terminal pin length 36. Each terminal pin of the second set of terminal pins 34 can have a second terminal pin length 38. The second terminal pin length 38 can be greater than the first terminal pin length 36, such that the second magnetic component assembly 16 can be stacked on or positioned over the first magnetic component assembly 14, the second set of terminal pins 34 being longer to electrically connect the second magnetic component assembly 16 to the printed circuit board 12.

Figure 4:
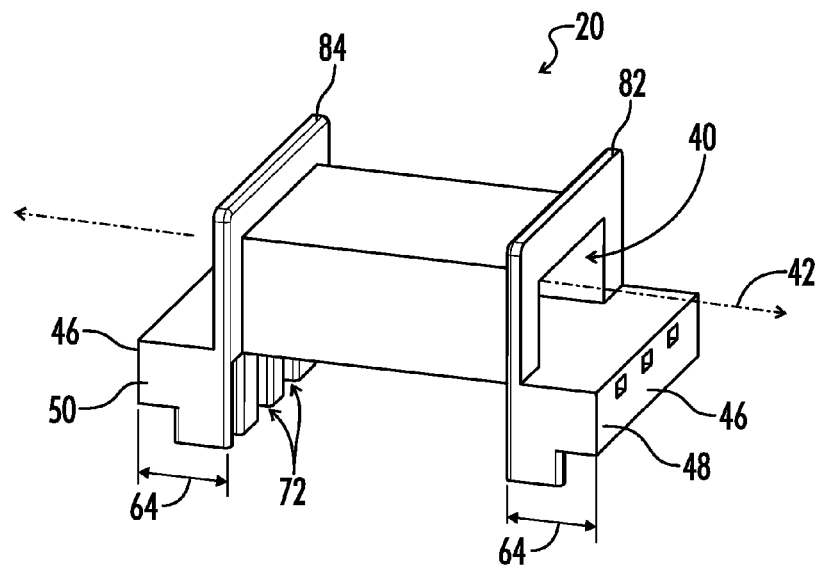
FIG. 4 is a front perspective view of a first or lower bobbin of the magnetic device of FIG. 2.

A perspective view of the first or lower bobbin 20 is shown in FIG. 4. The first bobbin 20 can have a first axial passage 40 having a first longitudinal axis 42. As shown in FIG. 3, the first core 22 can have a first core leg 44 extending into the first axial passage 40 of the first bobbin 20. Referring again to FIG. 4, the first bobbin 20 can have a first pair of bobbin pin rails 46, including a first bobbin first pin rail 48 and a first bobbin second pin rail 50. The first pair of pin rails 46 can be positioned at opposing ends of the first axial passage 40. As shown in FIG. 3, the first set of terminal pins 32 can be inserted into the first pair of bobbin pin rails 46 and be electrically connected to the printed circuit board 12.

Figure 5:
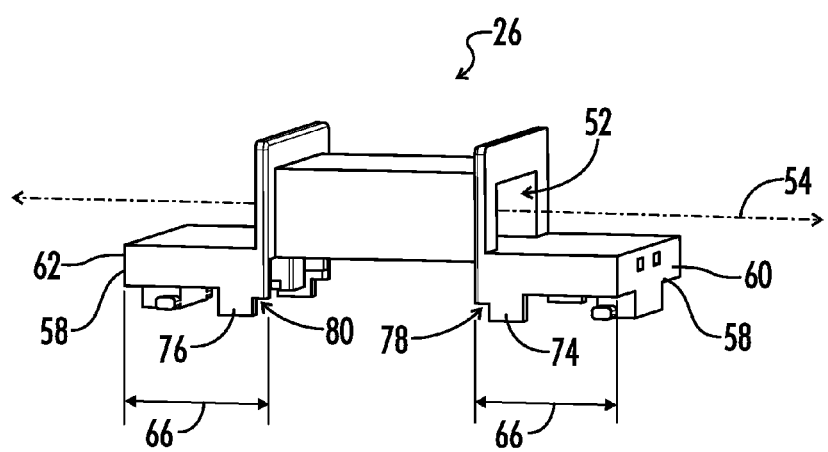
FIG. 5 is a front perspective view of a second or upper bobbin of the magnetic device of FIG. 2.

A perspective view of the second or upper bobbin 26 is shown in FIG. 5. The second bobbin 26 can have a second axial passage 52 having a second longitudinal axis 54. As shown in FIG. 3, the second core 28 can have a second core leg 56 extending into the second axial passage 52 of the second bobbin 26. Referring again to FIG. 5, the second bobbin 26 can have a second pair of bobbin pin rails 58, including a second bobbin first pin rail 60 and a second bobbin second pin rail 62. The second pair of pin rails 58 can be positioned at opposing ends of the second axial passage 52. As shown in FIG. 3, the second set of terminal pins 34 can be inserted into the second pair of bobbin pin rails 58 and be electrically connected to the printed circuit board 12.

As can be seen from FIG. 4 and FIG. 5, each pin rail of the first pair of bobbin pin rails 46 can have a first bobbin pin rail width 64. Each pin rail of the second pair of bobbin pin rails 58 can have a second bobbin pin rail width 66. The second bobbin pin rail width 66 can be greater than the first bobbin pin rail width 64, such that the second set of bobbin pin rails 58 can extend further outward in a lateral direction than the first set of bobbin pin rails 46 when the magnetic device 10 is assembled.

As shown in FIG. 3, the second magnetic component assembly 16 can then be positioned over the first magnetic component assembly 14. The second set of terminal pins 34 can extend downward from the second pair of pin rails 58 on the second bobbin 26 and be connected to the printed circuit board 12 without interference from the first magnetic component assembly 14. The second set of terminal pins 34 can include a first terminal pin 68 and a second terminal pin 70. The first terminal pin 68 an be included or inserted in the second bobbin first pin rail 60. The second terminal pin 70 an be included or inserted on the second bobbin second pin rail 62. In some embodiments, when the magnetic device 10 is assembled, the first magnetic component assembly 14 can be positioned between the first and second terminal pins 68 and 70 of the second set of terminal pins 34.

In FIG. 3, the first and second cores 22 and 28 are shown with each core including a pair of opposing E-cores. The middle legs of the pair of opposing E-cores are inserted into the axial passages 40 and 52 of the first and second bobbins 20 and 26 respectively. However, in other embodiments, any suitable core known in the art can be utilized for the first and second cores 22 and 28, including, but not limited to, C-cores, I-cores, U-cores, toroidal cores, etc.

Figure 6:
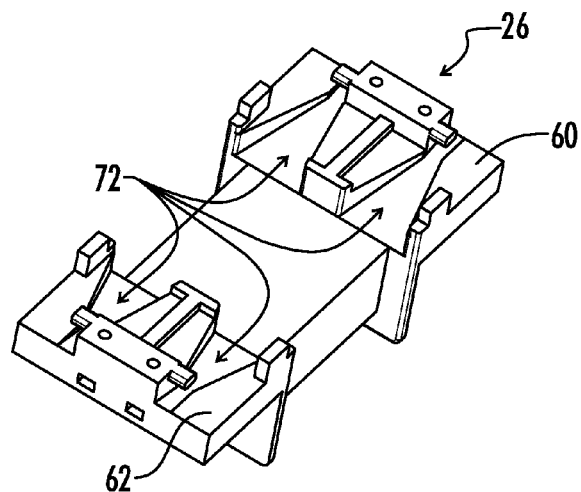
FIG. 6 is a bottom perspective view of the upper or second bobbin of FIG. 5.

A bottom perspective view of the second bobbin 26 is shown in FIG. 6. In some embodiments, the second bobbin 26 can include one or more guide channels 72 defined in the second bobbin first pin rail 60 and the second bobbin second pin rail 62. The guide channels 72 can help facilitate connection of the second winding to the terminal pins on the second bobbin first pin rail 60 and the second bobbin second pin rail 62, which can help make the assembly process more efficient. As can be seen from FIG. 4, in some embodiments the first bobbin 20 can include similar guide channels 72 to help facilitate connection of the first winding to terminal pins inserted into the first bobbin first pin rail 48 and the first bobbin second pin rail 50.

Referring again to FIG. 5, the second bobbin 26 can include a first standoff 74 and a second standoff 76. The first standoff 74 extends from the second bobbin first pin rail 60, and the second standoff 76 extends from the second bobbin second pin rail 62. The first and second standoffs 74 and 76 can extend in a downward direction in some embodiments, as shown in FIG. 5. The first and second standoffs 74 and 76 can engage the first magnetic component assembly at different locations to position the second magnetic component assembly on the first magnetic component assembly. The first and second standoffs 74 and 76 can help provide a clearance or offset between the first and second windings when the magnetic device is assembled which can help reduce electrical and magnetic interference between the windings.

In some embodiments, the first and second standoffs 74 and 76 can each have an L-shaped configuration. The first standoff 74 can have a first notch 78 defined in an inner lower corner of the first standoff 74. The second standoff 76 can have a second notch 80 defined in an inner lower corner of the second standoff 76. The notches 78 and 80 can define the L-shape of the first and second standoffs 74 and 76 respectively. As the standoffs 74 and 76 engage the first magnetic component assembly, the notches 78 and 80 can allow the standoffs to rest on the first magnetic component assembly while also helping prevent lateral movement of the second magnetic component assembly on the first magnetic component assembly. In some embodiments, the second bobbin 26 can include a first set of standoffs on the second bobbin first pin rail 60, and a second set of standoffs on the second bobbin second pin rail 62. The first set of standoffs can each be similar to the first standoff 74 previously described, and the second sets of standoffs can each be similar to the second standoff 76 previously described. The inclusion of additional standoffs can help increase the stability and structural integrity of the second magnetic assembly stacked on the first magnetic component assembly.

Figure 7:
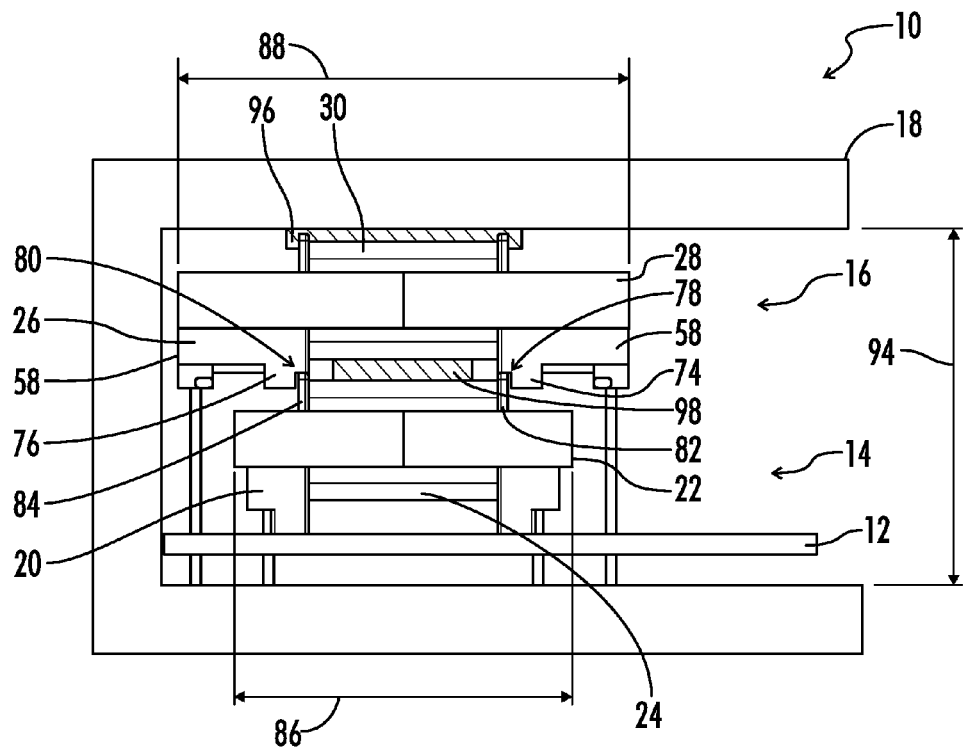
FIG. 7 is a side view of the magnetic device of FIG. 2.

The first and second standoffs 74 and 76 can be positioned or configured on the second bobbin 26 to engage different portions of the first magnetic assembly. As shown in FIG. 3 and FIG. 7, in some embodiments, the second bobbin 26 can be positioned on the first bobbin 20, with the standoffs 74 and 76 engaging the first bobbin 20 on the first magnetic component assembly 14. The first bobbin 20 can include a first retention flange 82 and a second retention flange 84. The first winding 24 can be positioned and retained between the first and second retention flanges 82 and 84. The second bobbin 26 bobbin can be positioned on the first and second retention flanges 82 and 84, with the first and second standoffs 74 and 76 engaging the first and second retention flanges 82 and 84 respectively. From FIG. 7 it can be seen that the first and second notches 78 and 80 can engage or rest against the sides of the first and second retention flanges 82 and 84 respectively to help prevent lateral movement of the second magnetic component assembly 16 on the first magnetic component assembly 14.

Figure 8:
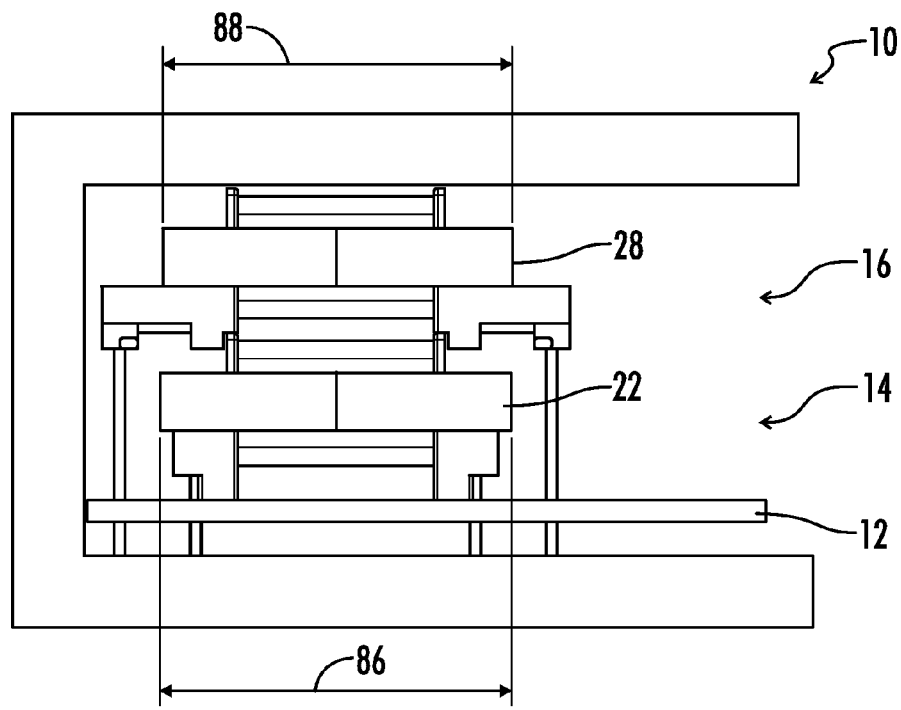
FIG. 8 is a side view of another embodiment of a magnetic device where the cores on the two magnetic component assemblies have substantially equal lengths.

As shown in FIG. 7, the first core 22 can have a first core length 86, and the second core 28 can have a second core length 88. In some embodiments, the second core length 88 can be greater than the first core length 86 with the second core 28 positioned on the wider second pair of bobbin pin rails 58. A core having increased size can help increase the magnetic flux within the second core 28 which can help increase the efficiency of the second magnetic component 16. In other embodiments, as shown in FIG. 8, the first core length 86 can be substantially equal to the second core length 88. In such a configuration, cores of the same size can be used for both the first core 22 and the second core 28, which can help make the manufacturing process cheaper and more efficient as only one sized core is needed.

Figure 9:
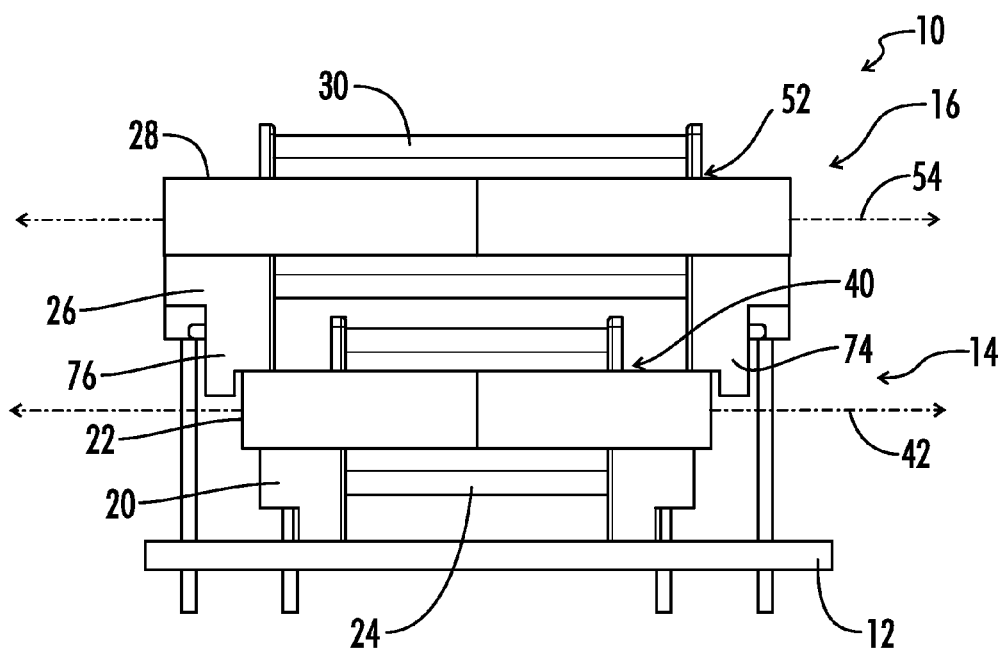
FIG. 9 is a side view of another embodiment of a magnetic device where a second bobbin of a second magnetic component assembly is positioned on a first core of a first magnetic component assembly.
Figure 10:
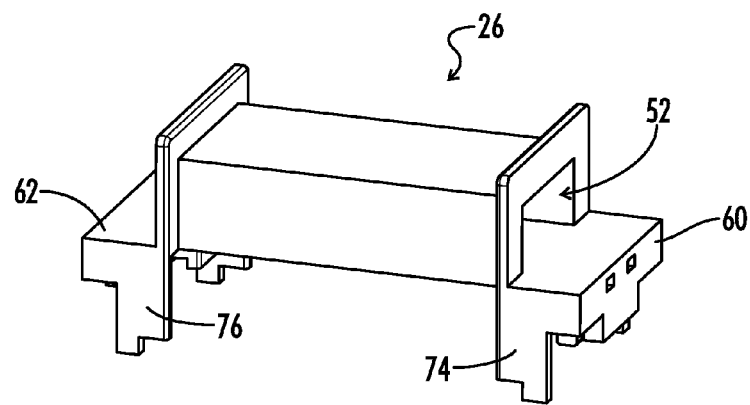
FIG. 10 is a perspective view of a second or upper bobbin of the magnetic device of FIG. 9.

In other embodiments, as shown in FIG. 9, the second bobbin 26 can be positioned on the first core 22 of the first magnetic component 14, with the standoffs 74 and 76 of the second bobbin 26 engaging opposing sides of the first core 22. A second bobbin 26 of the embodiment of FIG. 9 is shown in FIG. 10. The axial passage 52 of the second bobbin 26 is longer than the axial passage 52 of the second bobbin 26 of FIG. 5, such that the first and second standoffs 74 and 76 of the second bobbin 26 of FIG. 10 can be positioned over opposing ends of the first core, as opposed to the first and second retention flanges of the first bobbin. The standoffs 74 and 76 of FIG. 10 are also longer than the standoffs 74 and 76 shown in FIG. 5, such that the standoffs 74 and 76 of FIG. 10 can rest on the first core 22 while still maintaining an offset between the first and second windings 24 and 30, as shown in FIG. 9.

Figure 11:
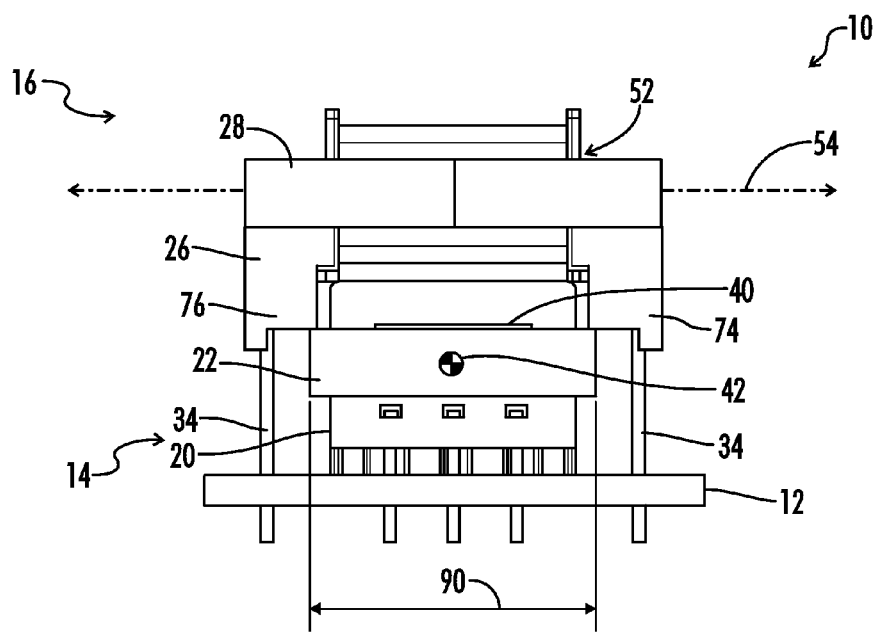
FIG. 11 is a front view of another embodiment of a magnetic device having first and second magnetic component assemblies oriented transverse to one another.
Figure 12:
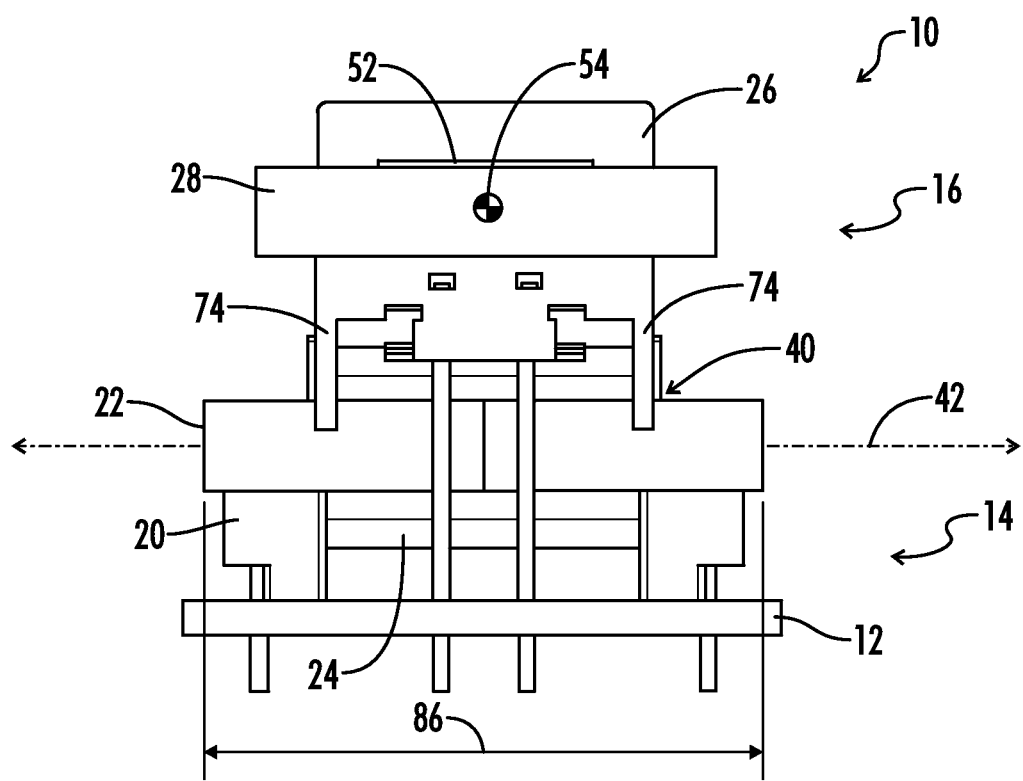
FIG. 12 is a side view of the magnetic device of FIG. 11.

As shown in FIG. 9, in some embodiments the first longitudinal axis 42 of the first axial passage 40 can be oriented substantially parallel to the second longitudinal axis 54 of the second axial passage 52. As such, the magnetic component assemblies 14 and 16 can generally be oriented parallel to one another. In other embodiments as shown in FIGS. 11 and 12, the first longitudinal axis 42 of the first axial passage 40 can be oriented substantially transverse to the second longitudinal axis 54 of the second axial passage 52. As such, the first and second magnetic component assemblies 14 and 16 can generally be oriented substantially transverse to one another. In some embodiments, the first and second longitudinal axes 42 and 54 can be oriented substantially perpendicular to one another. In the embodiment of FIGS. 11 and 12, the standoffs 74 and 76, engage the first core 22 of the first magnetic component 14.

The first core width 90, shown in FIG. 11, can be less than the first core length 86 shown in FIG. 12. As such, with the first and second magnetic component assemblies 14 and 16 oriented substantially transverse to one another. The second magnetic component assembly 16, and in particular the second bobbin 26, would not have to be as wide for the second set of terminal pins 34 to clear the first magnetic component assembly 14. As such, the size of the second magnetic component assembly 16 can be reduced. Such a configuration could additionally help further reduce the board space required to connect both magnetic component assemblies 14 and 16 to the printed circuit board 12, as well as help decrease the overall size of the magnetic device 10.

As shown in FIG. 7, an additional benefit of having stacked magnetic component assemblies 14 and 16 is that in those embodiments including an enclosure 18 at least partially surrounding the first and second magnetic components 14 and 16, the first and second magnetic components 14 and 16 can occupy a substantial portion of the height 94 of the enclosure 18. As such, the second winding 30 can be positioned in close proximity to the enclosure 18. The first and second magnetic component assemblies 14 and 16 being stacked can therefore help optimize the space within the enclosure 18.

Additionally, in some embodiments, a first layer of thermal potting material 96 can be disposed between the second winding 30 and the enclosure 18. The first layer of thermal potting material 96 can help transfer heat from the second winding 30 to the enclosure 18. In some embodiments, a second layer of thermal potting material 98 can be disposed between the first and second windings 24 and 30, such that heat from the first winding 24 can be transferred to the second winding 30 and subsequently to the enclosure 18. Transferring heat from the windings 24 and 30 to the enclosure 18 can help increase thermal dissipation of heat from the windings 24 and 30 to the ambient air. In conventional solutions having side by side magnetic component assemblies, the windings can be spaced apart from the enclosure such that a substantial amount of thermal potting material must be placed between the enclosure and each winding. The stacked magnetic component assembly configuration of FIG. 7 can help reduce the amount of thermal potting material used in the magnetic device 10, which can help decrease the cost of the overall magnetic device 10.

Thus, although there have been described particular embodiments of the present invention of a new and useful Stacked Magnetic Assembly it is not intended that such references be construed as limitations upon the scope of this invention except as set forth in the following claims.

What is claimed is:

1. A magnetic device for an electronic circuit comprising:
   a printed circuit board;
   a first magnetic component assembly electrically connected to the printed circuit board, wherein the first magnetic component assembly comprises
      a first bobbin, wherein the first bobbin includes a first bobbin first retention flange and a first bobbin second retention flange,
      a first core extending through the first bobbin, and
      a first winding disposed around the first bobbin, the first winding positioned between the first bobbin first retention flange and the first bobbin second retention flange;

and
a second magnetic component assembly electrically connected to the printed circuit board, the second magnetic component assembly stacked on the first magnetic component assembly, wherein the second magnetic component assembly comprises
a second bobbin,
a second core extending through the second bobbin, and
a second winding disposed around the second bobbin;
wherein the second bobbin of the second magnetic component assembly is positioned on the first bobbin of the first magnetic component assembly with the second bobbin positioned on the first bobbin first retention flange and the first bobbin second retention flange.

2. A magnetic device for an electronic circuit comprising:
a printed circuit board;
a first magnetic component assembly electrically connected to the printed circuit board, wherein the first magnetic component assembly further comprises
a first bobbin,
a first core extending through the first bobbin, and
a first winding disposed around the first bobbin;
and
a second magnetic component assembly electrically connected to the printed circuit board, the second magnetic component assembly stacked on the first magnetic component assembly, wherein the second magnetic component assembly further comprises
a second bobbin,
a second core extending through the second bobbin, and
a second winding disposed around the second bobbin;
wherein the second bobbin of the second magnetic component assembly further comprises:
a second bobbin first pin rail having a first standoff extending downward from the first pin rail, and
a second bobbin second pin rail having a second standoff extending downward from the second pin rail;
and
wherein the first and second standoffs engage the first magnetic component assembly to position the second magnetic component assembly on the first magnetic component assembly.

3. The magnetic device of claim 2, wherein the first and second standoffs each have an L-shaped profile.

4. The magnetic device of claim 2, wherein:
the first bobbin includes a first axial passage having a first longitudinal axis, the first core extending through the first axial passage;
the second bobbin includes a second axial passage having a second longitudinal axis, the second core extending through the second axial passage; and
the first longitudinal axis is oriented substantially parallel to the second longitudinal axis.

5. The magnetic device of claim 2, wherein:
the first bobbin includes a first axial passage having a first longitudinal axis, the first core extending through the first axial passage;
the second bobbin includes a second axial passage having a second longitudinal axis, the second core extending through the second axial passage; and
the first longitudinal axis is oriented substantially transverse to the second longitudinal axis.

6. The magnetic device of claim 2, wherein the second bobbin of the second magnetic component assembly is positioned on the first core of the first magnetic component assembly.

7. The magnetic device of claim 6, wherein:
the first core has a first core length;
the second core has a second core length; and
the second core length is greater than the first core length.

8. A magnetic device for an electronic circuit comprising:
a printed circuit board;
a first magnetic component assembly electrically connected to the printed circuit board; and
a second magnetic component assembly electrically connected to the printed circuit board, the second magnetic component assembly stacked on the first magnetic component assembly;
wherein:
the first magnetic component assembly includes a first set of terminal pins electrically connecting the first magnetic component assembly to the printed circuit board, each terminal pin in the first set of terminal pins having a first terminal pin length;
the second magnetic component assembly includes a second set of terminal pins electrically connecting the second magnetic component assembly to the printed circuit board, each terminal pin in the second set of terminal pins having a second terminal pin length; and
the second terminal pin length is greater than the first terminal pin length.

9. The magnetic device of claim 8, further comprising an enclosure at least partially covering the first and second magnetic component assemblies.

10. The magnetic device of claim 9, further comprising a first layer of thermal potting material disposed between the enclosure and the second winding on the second magnetic component assembly.

11. The magnetic device of claim 10, further comprising a second layer of thermal potting material disposed between the second winding on the second magnetic component and the first winding on the first magnetic component assembly.

12. A magnetic device for an electronic circuit comprising:
a printed circuit board;
a lower magnetic component assembly electrically connected to the printed circuit board, the lower magnetic component assembly including a lower bobbin; and
an upper magnetic component assembly electrically connected to the printed circuit board, the upper magnetic component assembly including an upper bobbin, the lower magnetic component assembly positioned between the upper magnetic component assembly and the printed circuit board, the upper magnetic component assembly resting on the lower magnetic component assembly, the upper bobbin configured to rest on the lower bobbin such that the upper magnetic component assembly is stacked on the lower magnetic component assembly;
wherein:
the upper bobbin includes an upper bobbin first pin rail and an upper bobbin second pin rail;
the upper bobbin first pin rail includes a first terminal pin electrically connected to the printed circuit board;
the upper bobbin second pin rail includes a second terminal pin electrically connected to the printed circuit board; and the lower magnetic component is positioned between the first and second terminal pins.

13. A magnetic device comprising: a printed circuit board: a first magnetic component assembly electrically connected to the printed circuit board, the first magnetic component assembly comprising a first bobbin having a first axial passage; a first core having a first core leg extending into the first axial passage; and a first winding disposed around the first bobbin; a second magnetic component assembly electrically connected to the printed circuit board, the second magnetic component comprising a second bobbin having a second axial passage, a second core having a second core leg extending into the second axial passage, and a second winding disposed around the second bobbin: and wherein the first magnetic component assembly is positioned between the second magnetic component assembly and the printed circuit board; and wherein: the first bobbin includes a first pair of bobbin pin rails positioned at opposing ends of the first axial passage, each bobbin pin rail of the first pair of bobbin pin rails having a first bobbin pin rail width; the second bobbin includes a second pair of bobbin pin rails positioned at opposing ends of the second axial passage, each bobbin pin rail of the second pair of bobbin pin rails having a second bobbin pin rail width; and the second bobbin pin rail width is greater than the first bobbin pin rail.

14. The magnetic device of claim 13, wherein:
the first core has a first core length;
the second core has a second core length; and
the first and second core lengths are substantially equal.

\* \* \* \* \*